United States Patent
Cho et al.

(10) Patent No.: US 8,952,716 B2
(45) Date of Patent: Feb. 10, 2015

(54) METHOD OF DETECTING DEFECTS IN A SEMICONDUCTOR DEVICE AND SEMICONDUCTOR DEVICE USING THE SAME

(75) Inventors: Yong Min Cho, Suwon-si (KR); Dong-Ryul Lee, Suwon-si (KR)

(73) Assignee: Samsung Electronics Co., Ltd., Suwon-si, Gyeongg-do (KR)

( * ) Notice: Subject to any disclaimer, the term of this patent is extended or adjusted under 35 U.S.C. 154(b) by 399 days.

(21) Appl. No.: 13/416,098

(22) Filed: Mar. 9, 2012

(65) Prior Publication Data

US 2012/0268159 A1   Oct. 25, 2012

(30) Foreign Application Priority Data

Apr. 25, 2011   (KR) ........................ 10-2011-0038609

(51) Int. Cl.
| | | |
|---|---|---|
| *G01R 31/327* | (2006.01) | |
| *G11C 29/02* | (2006.01) | |
| *H01L 27/108* | (2006.01) | |
| *G01R 31/28* | (2006.01) | |
| *G01R 31/307* | (2006.01) | |
| *G11C 11/40* | (2006.01) | |
| *H01L 21/66* | (2006.01) | |
| *H01L 49/02* | (2006.01) | |
| *G11C 29/50* | (2006.01) | |

(52) U.S. Cl.
CPC ........ *G11C 29/022* (2013.01); *H01L 27/10855* (2013.01); *H01L 27/10894* (2013.01); *G01R 31/2884* (2013.01); *G01R 31/307* (2013.01); *G11C 11/40* (2013.01); *H01L 22/30* (2013.01); *H01L 28/40* (2013.01); *G11C 2029/5002* (2013.01)

USPC ............ 324/762.01; 324/762.03; 324/762.05; 257/48; 438/18

(58) Field of Classification Search
CPC ............. G01R 31/307; G01R 31/2846; G01R 31/327; G01R 31/3333
USPC ............. 324/537–763.02; 438/14–18; 257/48
See application file for complete search history.

(56) References Cited

U.S. PATENT DOCUMENTS

| | | | |
|---|---|---|---|
| 7,679,083 B2 | 3/2010 | Sun et al. | |
| 7,772,867 B2* | 8/2010 | Guldi et al. | ............... 324/762.05 |
| 2008/0056571 A1* | 3/2008 | Watanabe | ...................... 382/173 |
| 2008/0237586 A1* | 10/2008 | Sun et al. | ......................... 257/48 |
| 2009/0152595 A1* | 6/2009 | Kaga et al. | ..................... 257/208 |
| 2012/0007073 A1* | 1/2012 | Mehta et al. | ..................... 257/48 |

FOREIGN PATENT DOCUMENTS

| | | |
|---|---|---|
| KR | 10-2006-0119189 A | 11/2006 |
| KR | 10-2007-0105201 A | 10/2007 |
| KR | 10-2008-0089146 A | 10/2008 |

OTHER PUBLICATIONS

V. Baglin et al, "The Secondary Electron Yield of Technical Materials and Its Variation With Surface Treatments", Proceedings of EPAC 2000, Vienna, Austria, p. 217~221.

* cited by examiner

*Primary Examiner* — Jermele M Hollington
*Assistant Examiner* — Emily Chan
(74) *Attorney, Agent, or Firm* — Lee & Morse, P.C.

(57) ABSTRACT

A method of detecting a defect of a semiconductor device includes forming test patterns and unit cell patterns in a test region a cell array region of a substrate, respectively, obtaining reference data with respect to the test patterns by irradiating an electron beam into the test region, obtaining cell data by irradiating the electron beam into the cell array region, and detecting defects of the unit cell patterns by comparing the obtained cell data with the obtained reference data.

18 Claims, 15 Drawing Sheets

METHOD OF DETECTING DEFECTS IN A SEMICONDUCTOR DEVICE AND SEMICONDUCTOR DEVICE USING THE SAME

CROSS-REFERENCE TO RELATED APPLICATIONS

This U.S. non-provisional patent application claims priority under 35 U.S.C. §119 of Korean Patent Application No. 10-2011-0038609, filed on Apr. 25, 2011, the entire contents of which are hereby incorporated by reference.

BACKGROUND

1. Field

The present inventive concept herein relates to a method of detecting defects in a semiconductor device, and a semiconductor device using the same.

2. Description of the Related Art

Many methods are used to detect an electrical defect of a contact plug in a semiconductor device. However, there are a lot of difficulties to set optimum test conditions in such methods due to many parameters affecting a real test and structural factors of the testing equipment.

SUMMARY

Embodiments of the inventive concept provide a method of detecting a defect in a semiconductor device.

Example embodiments may provide a method of detecting a defect of a semiconductor device, including forming test patterns and unit cell patterns in a test region a cell array region of a substrate, respectively, obtaining reference data with respect to the test patterns by irradiating an electron beam into the test region, obtaining cell data by irradiating the electron beam into the cell array region, and detecting defects of the unit cell patterns by comparing the obtained cell data with the obtained reference data.

Forming the test patterns may include forming same circuits as in the unit cell patterns.

Forming the test region may include forming a normal region, a not-open region, and a bridge region in the substrate.

Forming the test patterns and the unit cell patterns on the substrate may include forming lower conductive portions on the test region and the cell array region of the substrate, forming an interlayer insulating layer covering the lower conductive portions, and patterning the interlayer insulating layer to form a unit cell contact hole in the cell array region, a normal contact hole in the normal region, and a bridge contact hole in the bridge region, wherein the unit cell contact hole exposes the lower conductive portion in the cell array region, the normal contact hole exposes the lower conductive portion in the normal region, the bridge contact hole exposes simultaneously at least two adjacent lower conductive portions in the bridge region, and the interlayer insulating layer is not patterned in the not-open region.

The method may further include forming a conductive layer to fill each contact hole, and forming an upper conductive pattern overlapping each lower conductive portion on the interlayer insulating layer, irradiating the electron beam being performed after forming the upper conductive pattern.

Obtaining reference data with respect to the test patterns by irradiating the electron beam may include measuring a first quantity of emitted electrons by irradiating the electron beam in the normal region, measuring a second quantity of emitted electrons by irradiating the electron beam in the not-open region, the second quantity being smaller than the first quantity, and measuring a third quantity of emitted electrons by irradiating the electron beam in the bridge region, the third quantity being greater than the first quantity, and the reference data being obtained from the first through third quantities.

Obtaining the cell data by irradiating the electron beam in the cell array region may include measuring a fourth quantity of emitted electrons from the unit cell patterns by irradiating the electron beam in the cell array region, the fourth quantity corresponding to the cell data, and detecting defects of the unit cell patterns by comparing the cell data with the reference data may include comparing the fourth quantity with the first through third quantities.

The upper conductive pattern may be a lower electrode of capacitor.

Forming the unit cell patterns and the test patterns may be simultaneous.

Example embodiments may also provide a method of detecting a defect of a semiconductor device, including forming test patterns and unit cell patterns in the a test region and a cell array region of a substrate, respectively, the test region including a normal region, a bridge region, and a not-open region, irradiating an electron beam into the test region and the cell array region, measuring a number of emitted electrons from each of the regions in the test region by the electron beam, measuring a number of emitted electrons from the cell array region by the electron beam, and detecting defects of the unit cell patterns by comparing the measured number of emitted electrons from the cell array region and the test region.

Forming the test patterns may include forming the test patterns in each of the normal region, bridge region, and not-open region.

Forming the test patterns may include forming a normal contact hole in the normal region, and forming a bridge contact hole in the bridge region, wherein no contact holes are formed in the not-open region.

Forming the test patterns and unit cell patterns may include simultaneously forming the test patterns in the test region and normal contact holes in the cell array region.

Comparing the measured number of emitted electrons from the cell array region and the test region may include comparing the number of emitted electrons in the cell array region to the number of emitted electrons from each of the normal region, bridge region, and not-open region of the test region.

Forming the test patterns and the unit cell patterns on the substrate may include forming a plurality of lower conductive portions on the test region and the cell array region of the substrate, forming an interlayer insulating layer covering the lower conductive portions, and patterning the interlayer insulating layer to form a unit cell contact hole in the cell array region, a normal contact hole in the normal region, and a bridge contact hole in the bridge region, wherein the unit cell contact hole exposes a first lower conductive portion of the plurality of lower conductive portions in the cell array region, the normal contact hole exposes a second lower conductive portion of the plurality of lower conductive portions in the normal region, the bridge contact hole exposes simultaneously at least third and fourth lower conductive portions of the plurality of lower conductive portions in the bridge region, the third and fourth lower conductive portions being adjacent to each other, and the interlayer insulating layer having no patterns in the not-open region.

The method may further include forming a conductive layer to fill each contact hole, and forming an upper conductive pattern overlapping each lower conductive portion on the interlayer insulating layer, such that the electron beam is irradiated onto the upper conductive pattern.

Measuring the number of emitted electrons may include measuring a first quantity of emitted electrons by the electron beam in the normal region, measuring a second quantity of emitted electrons by the electron beam in the not-open region, the second quantity being smaller than the first quantity, and measuring a third quantity of emitted electrons by the electron beam in the bridge region, the third quantity being greater than the first quantity.

Measuring the number of emitted electrons may further include measuring a fourth quantity of emitted electrons from the unit cell patterns by the electron beam, detecting defects of the unit cell patterns including comparing the fourth quantity with each of the first through third quantities.

The upper conductive pattern may be a lower electrode of capacitor.

Example embodiments may also provide a semiconductor device, including a substrate including a cell array region and a test region, the test region being inside a chip region and including a normal region, a bridge region, and a not-open region, lower conductive portions disposed on each region of the substrate, an interlayer insulating layer covering the substrate, upper conductive patterns disposed on the interlayer insulating layer, the upper conductive patterns vertically overlapping the lower conductive portions on each region of the substrate, a unit cell contact plug penetrating the interlayer insulating layer on the cell array region to electrically connect corresponding lower conductive portion and upper conductive pattern, a normal contact plug penetrating the interlayer insulating layer on the normal region to electrically connect corresponding lower conductive portion and upper conductive pattern, and a bridge contact plug penetrating the interlayer insulating layer on the bridge region to electrically connect corresponding two adjacent lower conductive portions and two adjacent upper conductive patterns, simultaneously.

BRIEF DESCRIPTION OF THE FIGURES

Features will become apparent to those of ordinary skill in the art by describing in detail exemplary embodiments with reference to the attached drawings, in which.

DETAILED DESCRIPTION

Figure 1:
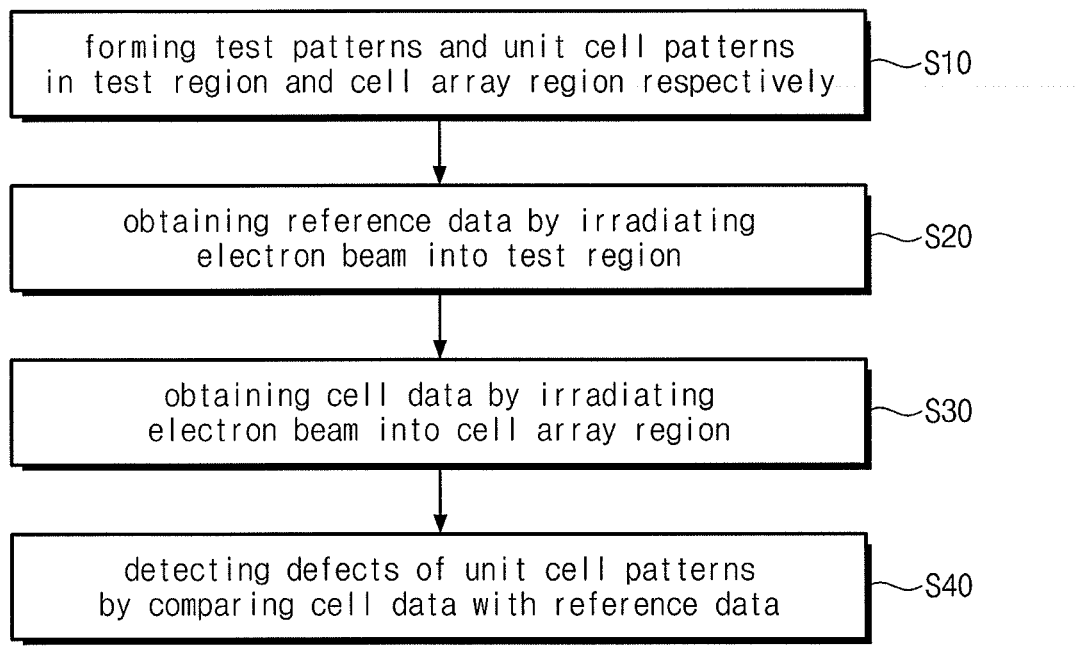
FIG. 1 illustrates a flow chart of stages in a method of detecting defects of a semiconductor device in accordance with an embodiment of the inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the inventive concept may be described with respect to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Hereinafter, referring to the drawings, embodiments of the inventive concept are described in detail.

FIG. 1 is a flow chart of a method of detecting defects of a semiconductor device in accordance with an embodiment of the inventive concept.

Referring to FIG. 1, a method of detecting defects of a semiconductor device in accordance with an embodiment may include forming test patterns and unit cell patterns in a test region of a substrate and a cell array region of a substrate, respectively (operation S10), obtaining reference data with respect to the test patterns by irradiating an electron beam into the test region (operation S20), obtaining cell data by irradiating an electron beam into the cell array region (operation S30), and comparing the cell data with the reference data to detect defects of unit cell patterns (operation S40).

In operation S10, the test region may include a normal region, a not-open region, and a bridge region. The unit cell patterns and the test patterns may be formed at the same time, i.e., simultaneously.

Operation S10 may include forming lower conductive portions in the test region and the cell array region, respectively, forming an interlayer insulating layer covering the lower conductive portions, and by patterning the interlayer insulating layer, forming a unit cell contact hole exposing the lower conductive portion in the cell array region, a normal contact hole exposing the lower conductive portion in the normal region, and a bridge contact hole exposing at least the two adjacent lower conductive portions in the bridge region. The interlayer insulating layer is not patterned in the not-open region. The lower conductive portion may be an impurity injection region formed in the substrate, or may contact a conductive patterns disposed in the lower portion.

Also, operation S10 may further include forming a contact plug filling each contact hole, and forming an upper conductive pattern overlapping each lower conductive portion and electrically being connected to the contact plug on the interlayer insulating layer. Irradiating an electron beam may be performed after forming the upper conductive pattern. The test patterns may have the same circuit as the unit cell patterns. That is, the test patterns may be identical to the unit cell patterns except the contact plug.

Operation S20 may include measuring a first quantity of emitted electrons by irradiating an electron beam into the normal region, measuring a second quantity of emitted electrons by irradiating an electron beam into the not-open region, and measuring a third quantity of emitted electrons by irradiating an electron beam into the bridge region. The first through third quantities constitute the reference data. The second quantity is smaller than the first quantity and the third quantity is greater than the first quantity.

Operation S30 may include detecting a fourth quantity of electrons being emitted from the unit cell patterns and constituting the cell data by irradiating an electron beam into the cell array region.

Operation S40 may include comparing the fourth quantity with the first through third quantities.

An illustration applying the method of detecting defects of a semiconductor device is described with respect to FIGS. 2 through 11.

FIGS. 2, 4, 6 through 11 are cross sectional views of stages in a method of detecting defects of a semiconductor device in accordance with an embodiment of the inventive concept.

Figure 2:
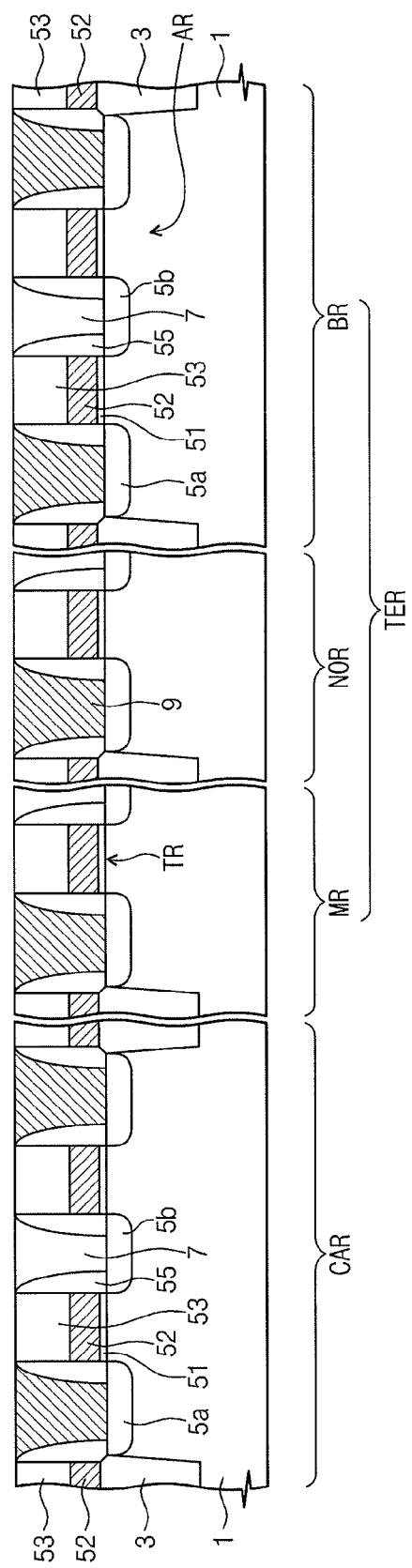
FIGS. 2, 4, and 6-11 illustrate cross sectional views of a method of detecting defects of a semiconductor device in accordance with an embodiment of the inventive concept.

Referring to FIG. 2, a substrate 1 including a cell array region CAR and a test region TER may be provided. The test region TER may include a normal region MR, a not-open region NOR, and a bridge region BR. A device isolation layer 3 may be formed in the substrate 1 to define an active region AR. A plurality of transistors TR may be formed on the substrate 1. The transistors TR may each include a gate insulating layer 51, a gate electrode 52, and a capping layer pattern 53 that are sequentially stacked, a spacer 55 covering a sidewall of the gate insulating layer 51, the gate electrode 52, and the capping layer pattern 53, and impurity implantation regions 5a and 5b formed in the substrate 1 of both sides of the spacer 55. The plurality of transistors TR may be formed in the same form in each region. A first interlayer insulating layer 7 may be formed, and then a planarization process may be performed on the first interlayer insulating layer 7 to fill spaces among the plurality of transistors TR. The first interlayer insulating layer 7 between two adjacent transistors TR may be removed, and a first buried contact plug 9 may be formed by a self aligned contact formation method. The first buried contact plug 9 and the impurity implantation regions 5a and 5b may correspond to the lower conductive portion.

Figure 4:
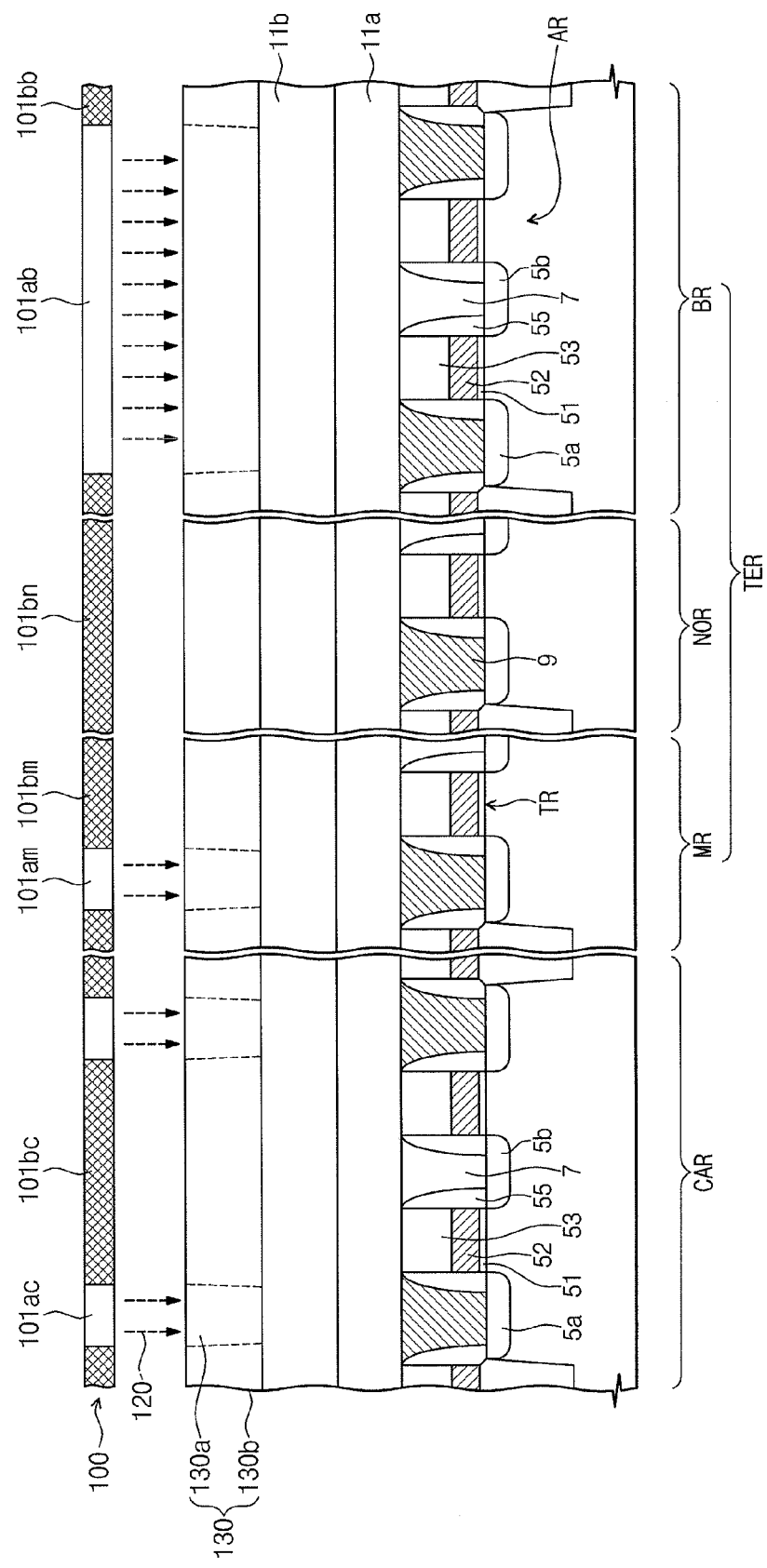

Referring to FIG. 4, a second interlayer insulating layer 11a and 11b may be formed on an entire surface of the substrate 1. The second interlayer insulating layer 11a and 11b may include two layers. A photoresist layer 130 may be formed on the second interlayer insulating layer 11a and 11b. An exposure process may be performed using a photomask 100.

Figure 3:
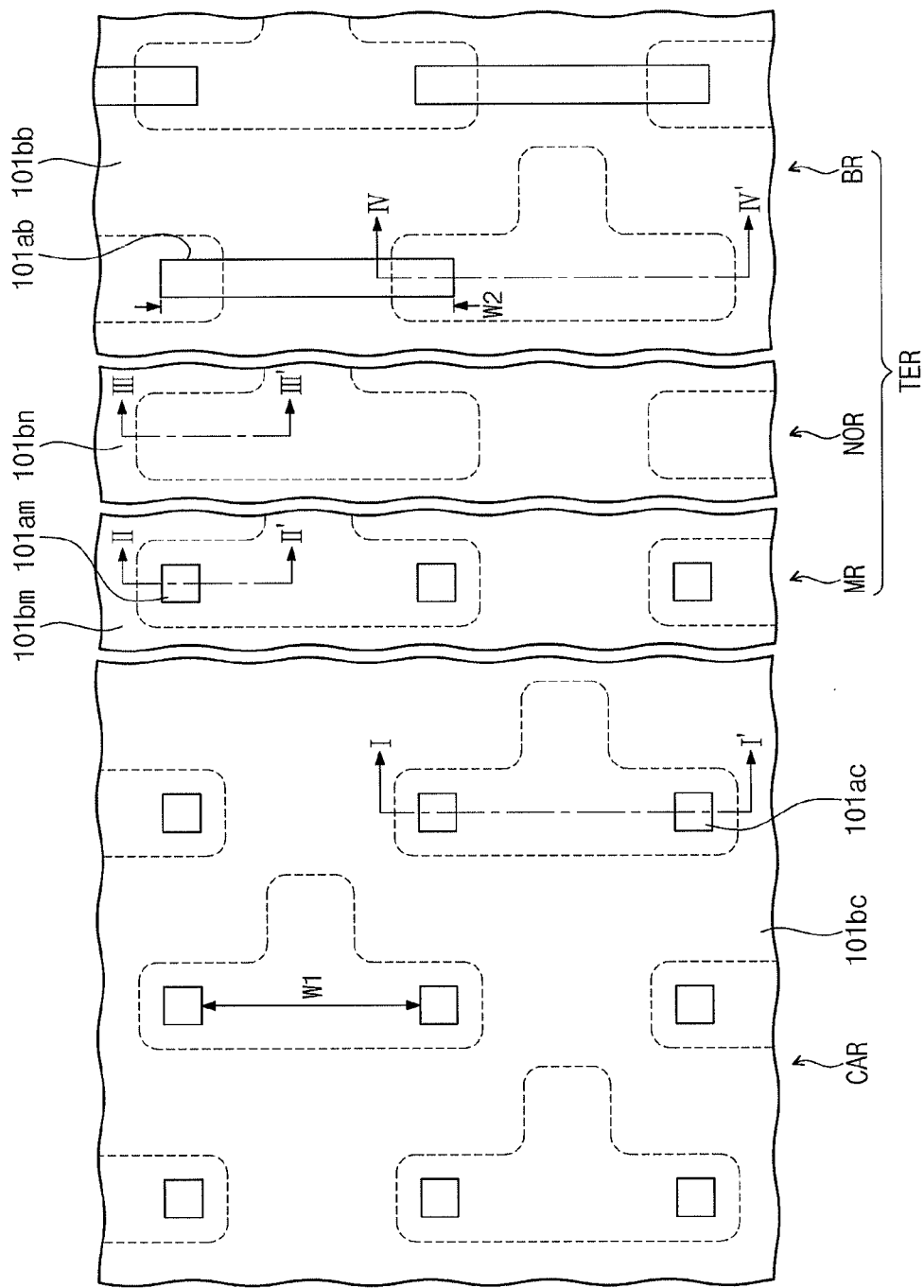
FIG. 3 illustrates a top plan view of a photomask used in the process of FIG. 4.

Referring to FIG. 3, the photomask 100 may include a test region TER including a normal region MR, a not-open region NOR, and a bridge region BR, and a cell array region CAR that correspond to each region of the substrate 1. FIG. 4 illustrates a cross sectional view taken along the lines I-I', II-II', III-III' and IV-IV' of the photomask 100 having the flat surface of FIG. 3.

Figure 5A:
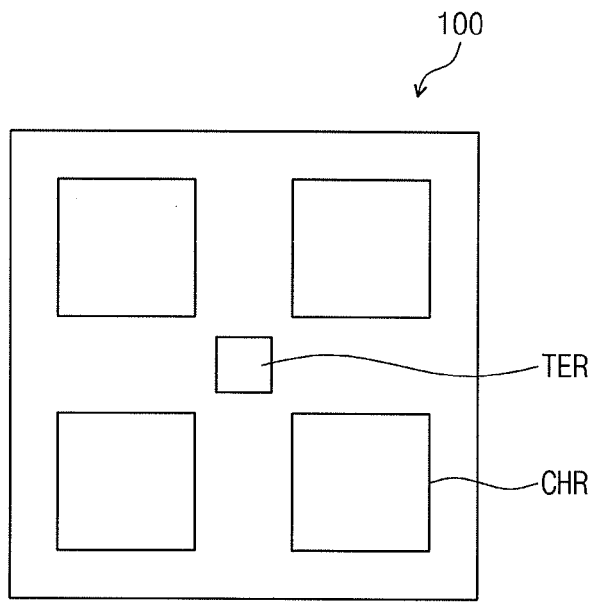
FIGS. 5A and 5B illustrate top plan views of a photomask in accordance with other embodiments of the inventive concept.
Figure 5B:
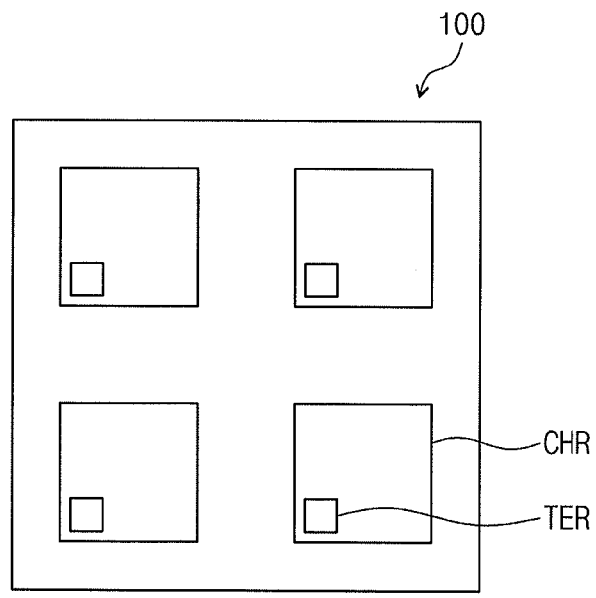

FIGS. 5A and 5B are top plan views of the photomask 100 in accordance with other embodiments of the inventive concept. Referring to FIGS. 5A and 5B, the photomask 100 may include a chip region CHR. The chip region CHR may include a cell array region CAR and a peripheral circuit region (not illustrated). As illustrated in FIG. 5A, the test region TER may be disposed, e.g., on a scribe lane region located outside the chip region CHR. As illustrated in FIG. 5B, the test region TER may be disposed, e.g., inside the chip region CHR.

Referring back to FIG. 3, the photomask 100 may include first parts 101ac, 101am and 101ab, and second parts 101bc, 101bm, 101bn and 101bb that have a layout for forming contact plugs. The first parts 101ac, 101am, and 101ab may be a first unit cell part 101ac, a first normal part 101am, and a first bridge part 101ab that are disposed on the region, respectively. The first normal part 101am may have the same form as the first unit cell part 101ac. The first bridge part 101ab may have a width W2 greater than a width W1 between two adjacent first unit parts 101ac. The second parts 101bc, 101bm, 101bn, and 101bb may be a second unit cell part 101bc, a second normal part 101bm, a second not-open part 101bn, and a second bridge part 101bb disposed on the regions, respectively. There may not be a first part in the not-open region NOR, so only the second not-open part 101bn may be in the not-open region NOR.

Referring to FIGS. 3 and 4, if the photoresist layer 130 is a positive type, i.e., where a region irradiated by a light is removed, the first parts 101ac, 101am, and 101ab may be penetration parts, i.e., regions through which light passes, and the second parts 101bc, 101bm, 101bn, and 101bb may be blocking parts, i.e., regions by which light is blocked out. In contrast, if the photoresist layer 130 is a negative type, i.e., where a region not irradiated by light is removed, the first parts 101ac, 101am, and 101ab may be blocking parts, i.e., regions by which light is blocked out, and the second parts 101bc, 101bm, 101bn, and 101bb may be penetration parts, i.e., regions through which light passes.

In FIG. 4, the photoresist layer 130 is illustrated as a positive type. Referring to FIG. 4, an exposure process may be performed using the photomask 100. Thus, light 120 passes through the first parts 101ac, 101am, and 101ab, and then penetrates the photoresist layer 130. As a result, the photoresist layer 130 may be divided into a part 130a, i.e., a region into which light is irradiated, and a part 130b, i.e., a region into which light is not irradiated.

Figure 6:
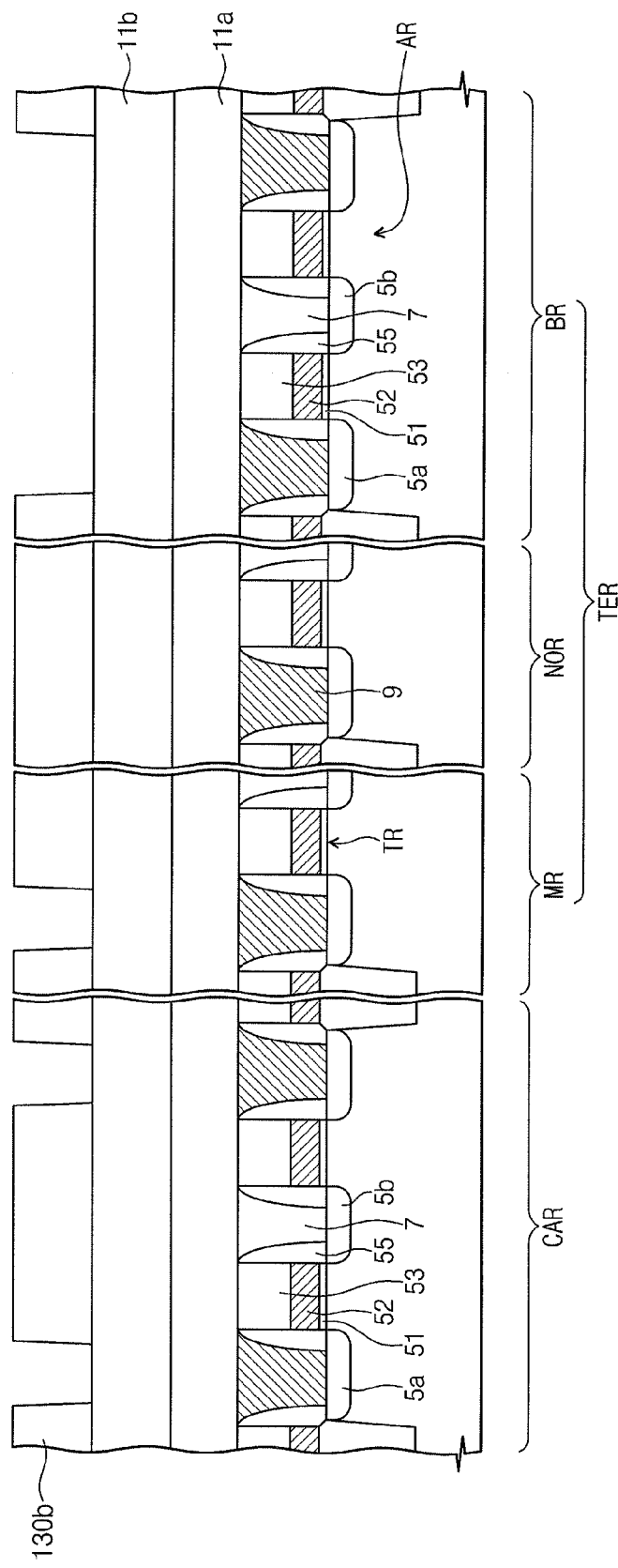

Referring to FIG. 6, a development process may be performed to remove the part 130a, i.e., the region into which light is irradiated. Thus, a photoresist mask pattern with the part 130b, i.e., a region into which light is not irradiated, may be formed.

Figure 7:
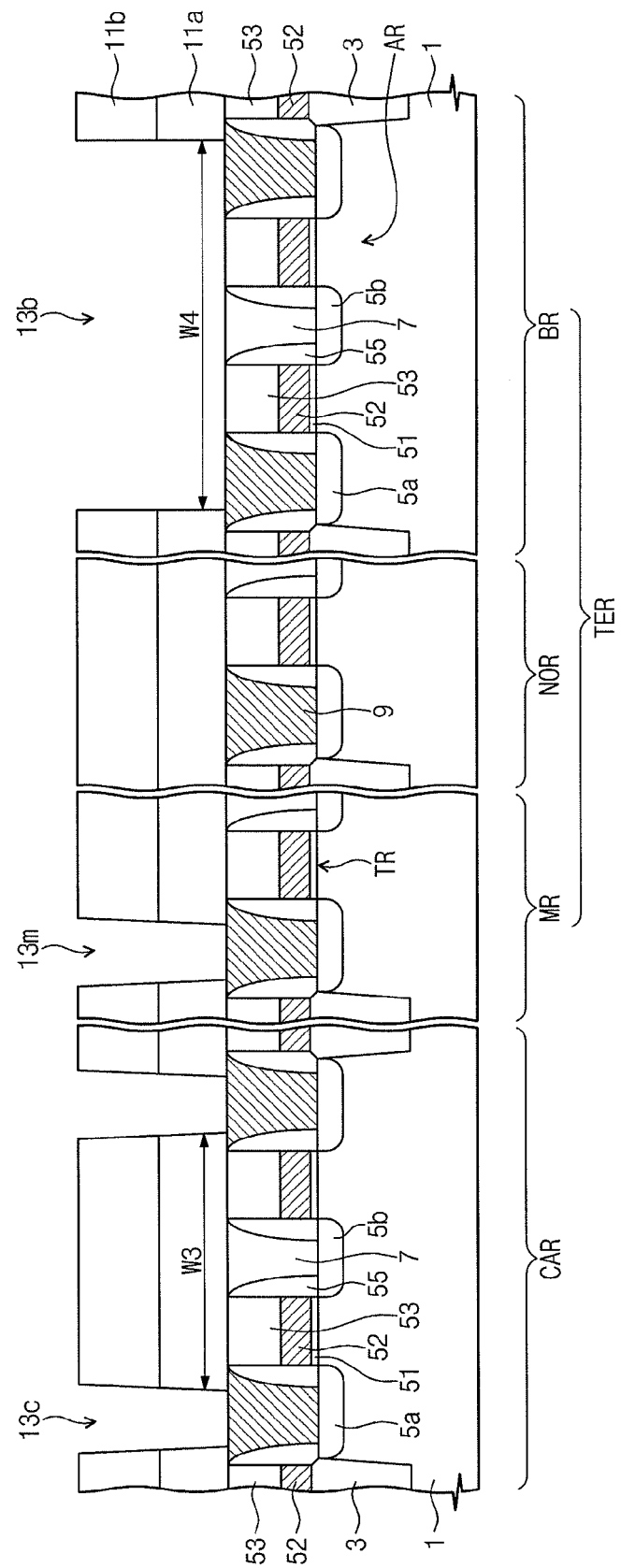

Referring to FIG. 7, the second interlayer insulating layer 11a and 11b may be etched using the photoresist mask pattern as an etching mask to form contact holes 13c, 13m, and 13b exposing top surfaces of the first buried contact plugs 9. The contact holes 13c, 13m, and 13b include a unit cell contact hole 13c, a normal contact hole 13m, and a bridge contact hole 13b. Because the second interlayer insulating layer 11a and 11b is not etched in the not-open region NOR, a contact hole exposing a top surface of the first buried contact plug 9 is not formed in the not-open region NOR. After forming the contact holes 13c, 13m, and 13b, the photoresist layer 130 may be removed by an ashing process. The bridge contact hole 13b may be formed to have a width W4 equal to or greater than a space W3 between two adjacent unit cell contact holes 13c. The bridge contact hole 13b may expose at least two adjacent first buried contact plugs 9 at the same time.

Figure 8:
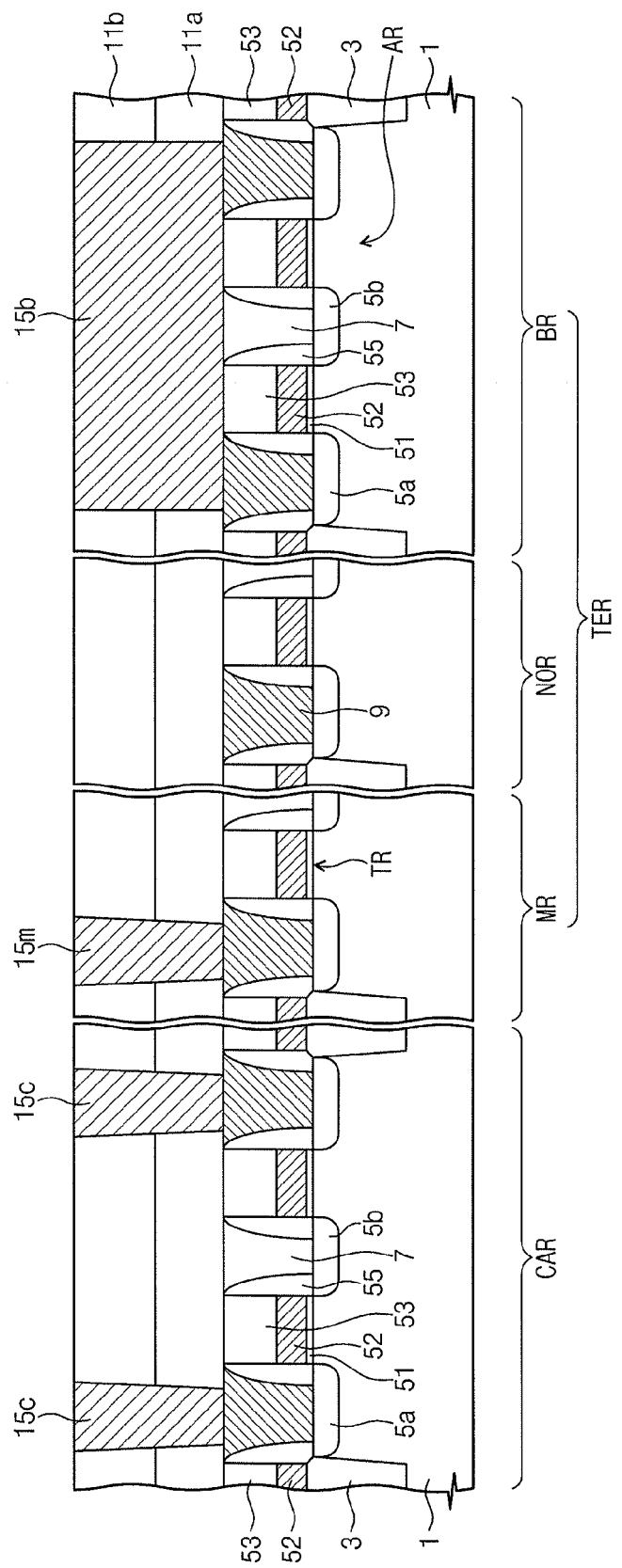

Referring to FIG. 8, a conductive layer may be formed to fill the contact holes 13c, 13m, and 13b, followed by a planarization etching process to remove an upper portion of the conductive layer, i.e., to expose a top surface of the second interlayer insulating layer 11a and 11b, thereby forming second buried contact plugs 15c, 15m, and 15b in respective contact holes 13c, 13m, and 13b. The second buried contact plugs 15c, 15m and 15b include a second unit cell buried contact plug 15c, a second normal buried contact plug 15m, and a second bridge buried contact plug 15b. A second buried contact plug may not be formed in the not-open region NOR.

Figure 9:
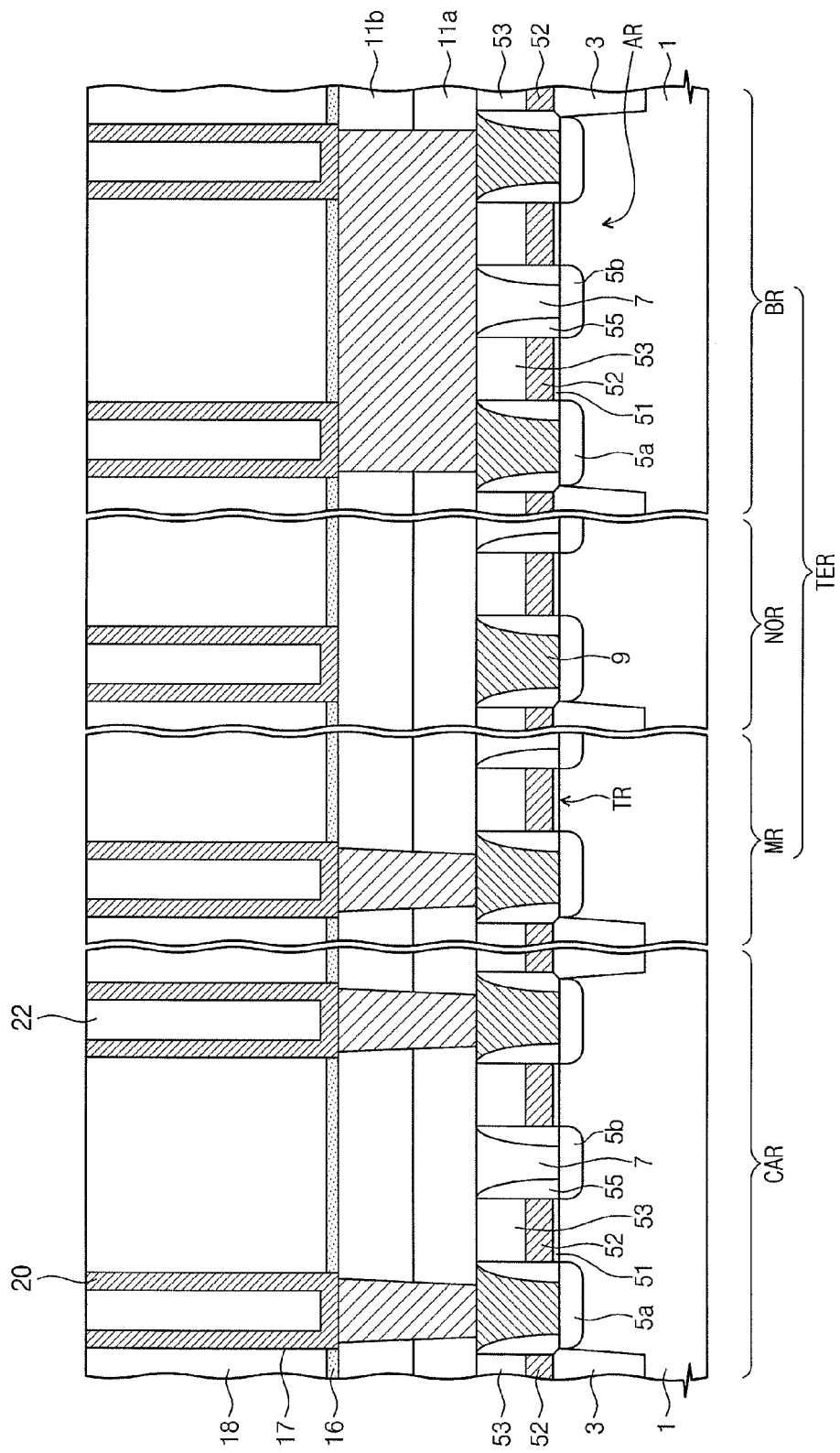

Referring to FIG. 9, a support layer 16 may be formed on the substrate 1. The support layer 16 may be, e.g., a silicon nitride layer. A mold layer 18 may be formed on the support layer 16. The mold layer 18 and the support layer 16 may be patterned to form a lower electrode hole 17 overlapping the first buried contact plug 9. The lower electrode hole 17 may be formed on all the regions CAR and TER including the not-open region NOR. After a lower electrode layer is conformally formed on the substrate 1 including the lower electrode hole 17, a buried insulating layer may be formed to fill the lower electrode hole 17. A planarization etching process (node separation process) may be performed down to a top surface of the mold layer 18 to form a lower electrode 20 having a cup shape and a buried insulating pattern 22 in the lower electrode hole 17. The lower electrode 20 may correspond to the upper conductive pattern.

Figure 10:
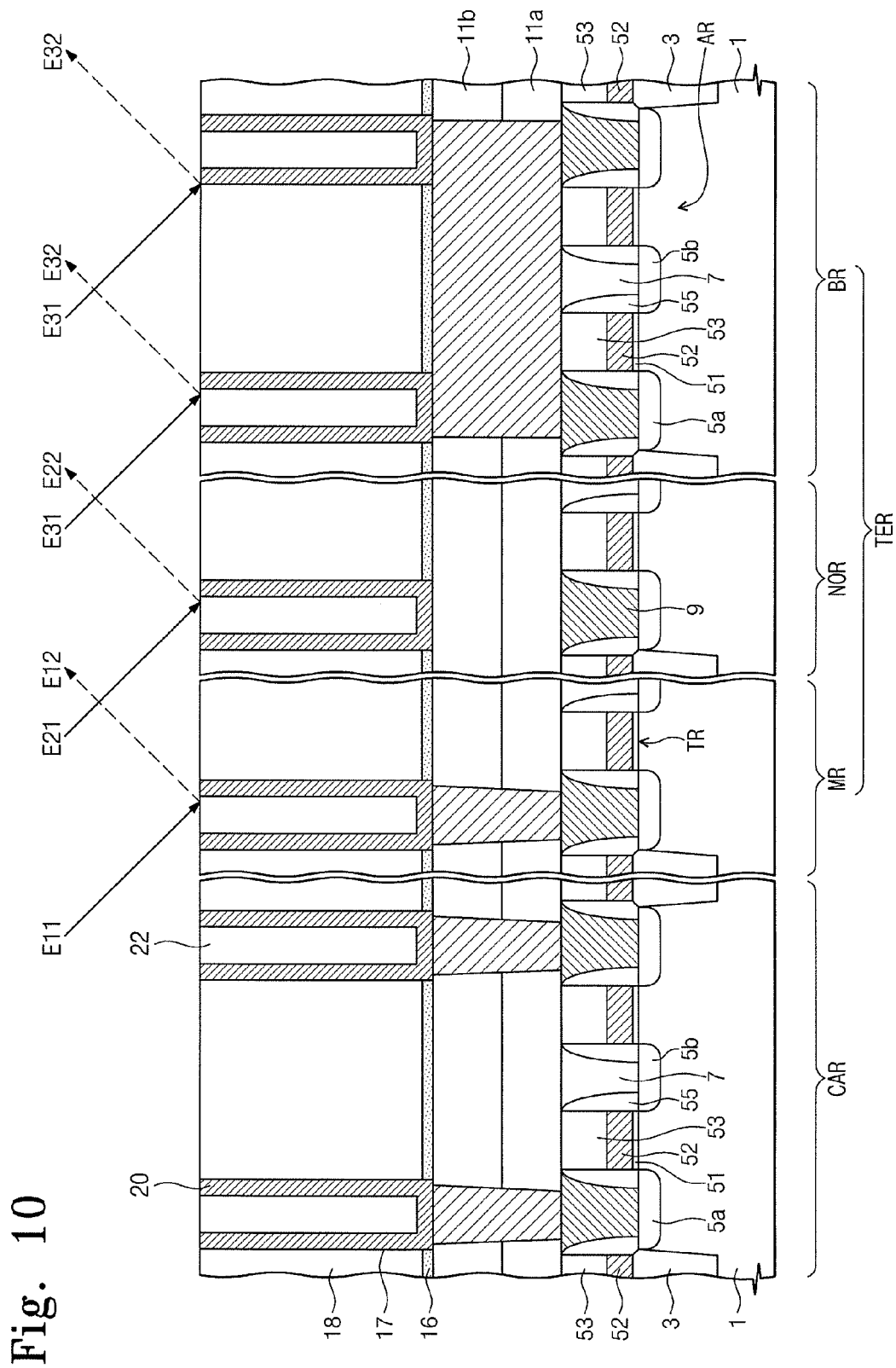

After the node separation process, referring to FIG. 10, first, second, and third electron beams E11, E21 and E31 may be irradiated onto top surfaces of the lower electrodes 20 of the test region TER to measure a quantity of emitted electrons. The electron beams E11, E21, and E31 may be irradiated using a SEM (scanning electron microscope).

More specifically, the first electron beam E11 is irradiated onto a surface of the lower electrode 20 of the normal region MR to measure a first quantity E12 of emitted electrons from the normal region MR. The second electron beam E21 is irradiated onto a surface of the lower electrode 20 of the not-open region NOR to measure a second quantity E22 of emitted electrons from the not-open region NOR. The third electron beam E31 is irradiated onto a surface of the lower electrode 20 of the bridge region BR to measure a third quantity E32 of emitted electrons from the bridge region BR. Since the lower electrode 20 and the first buried contact plug 9 are separated from each other in the not-open region NOR, electrons are not smoothly supplied from a lower portion of the substrate 1 to the lower electrode 20 in the not-open region NOR. Thus, the second quantity E22 is smaller than the first quantity E12. Since the bridge region BR may include two lower electrodes 20 connected to the two first buried contact plugs 9 by the second bridge buried contact plugs 15b, a leakage current may occur and cause a large quantity E32 of electrons supplied from a lower portion of the substrate 1. Thus, the third quantity E32 may be greater than the first quantity E12. Reference data may be obtained from the first through third quantities E12, E22 and E32, i.e., operation S20 in FIG. 1.

Figure 11:
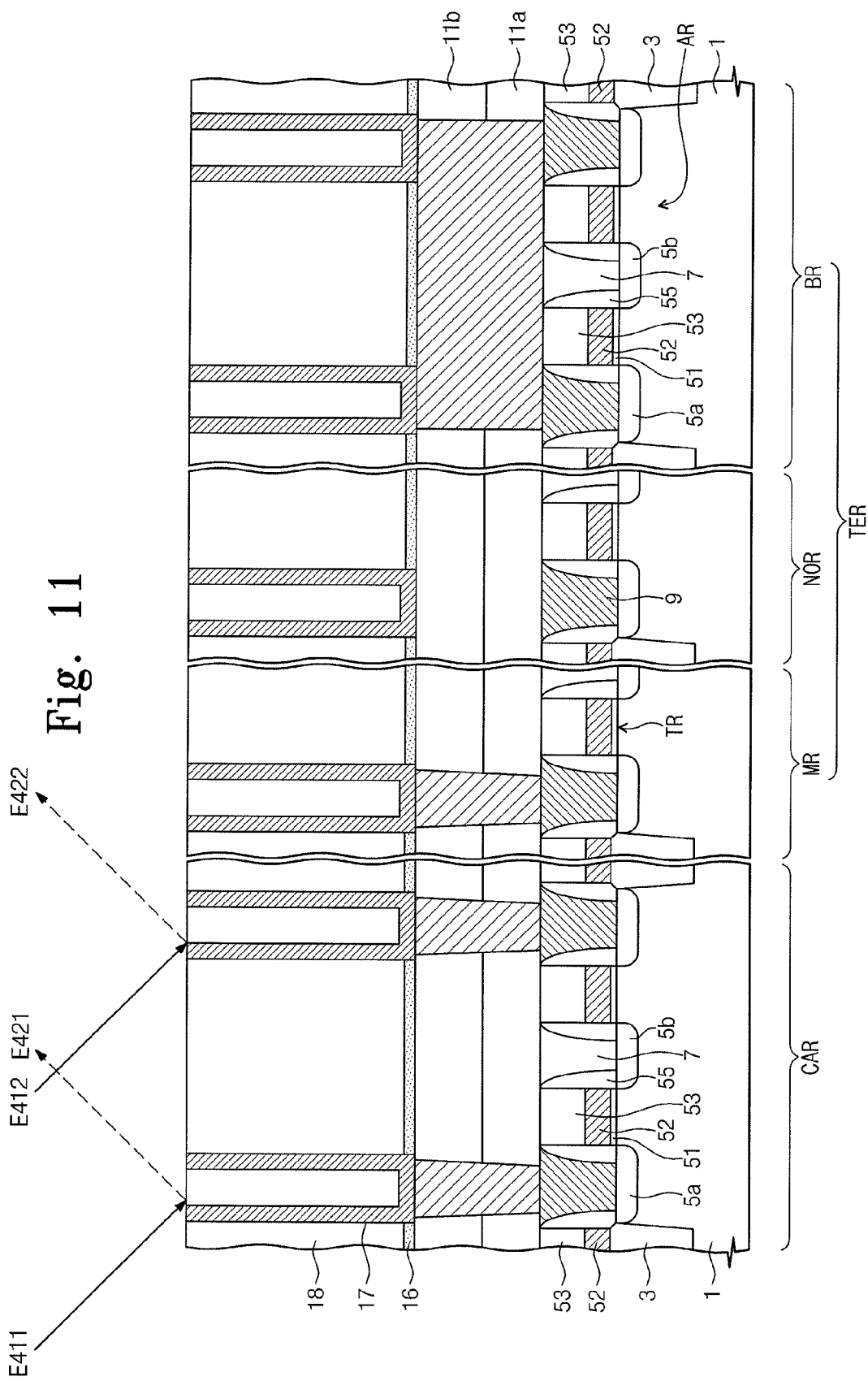

After obtaining reference data, referring to FIG. 11, fourth electron beams E411 and E412 may be irradiated onto top surfaces of the lower electrodes 20 of the unit cell patterns in the cell array region CAR to measure fourth quantities E421 and E422 of emitted electrons from the cell array region CAR. Cell data may be obtained from the fourth quantities E421 and E422, i.e., operation S30 in FIG. 1.

A defect may be detected by comparing the fourth quantities E421 and E422 with the first through third quantities E12, E22, and E32, respectively, i.e., operation S40 in FIG. 1. That is, if one of the measured values in the cell array region CAR, e.g., quantity E421, is equal/similar to the first quantity E12, it may be determined that the second buried contact plug, e.g., corresponding to the measured fourth quantity E421, has a normal state in the unit cell region in which the value is measured. Similarly, if one of the measured values in the cell array region CAR, e.g., quantity E422, is equal/similar to the second quantity E22, it may be determined that the tested second buried contact plug in the cell array region CAR has a not-open state, i.e., due to correspondence in value to the reference value of the contact plug in the not-open region NOR of the test region TER. If one of the measured values in the cell array region CAR, e.g., quantity E422, is equal/similar to the third quantity E32, it may be determined that the tested second buried contact plug in the cell array region CAR has a leakage, i.e., has a bridge state with an adjacent contact plug in the unit cell region due to correspondence in value to the reference value of the contact plug in the bridge region BR of the test region TER. In this manner, a defect of a semiconductor device may be detected.

Irradiating the electron beam may be performed before forming the lower electrode and after forming the second buried contact plugs 15c, 15m, and 15b of FIG. 8.

Figure 12:
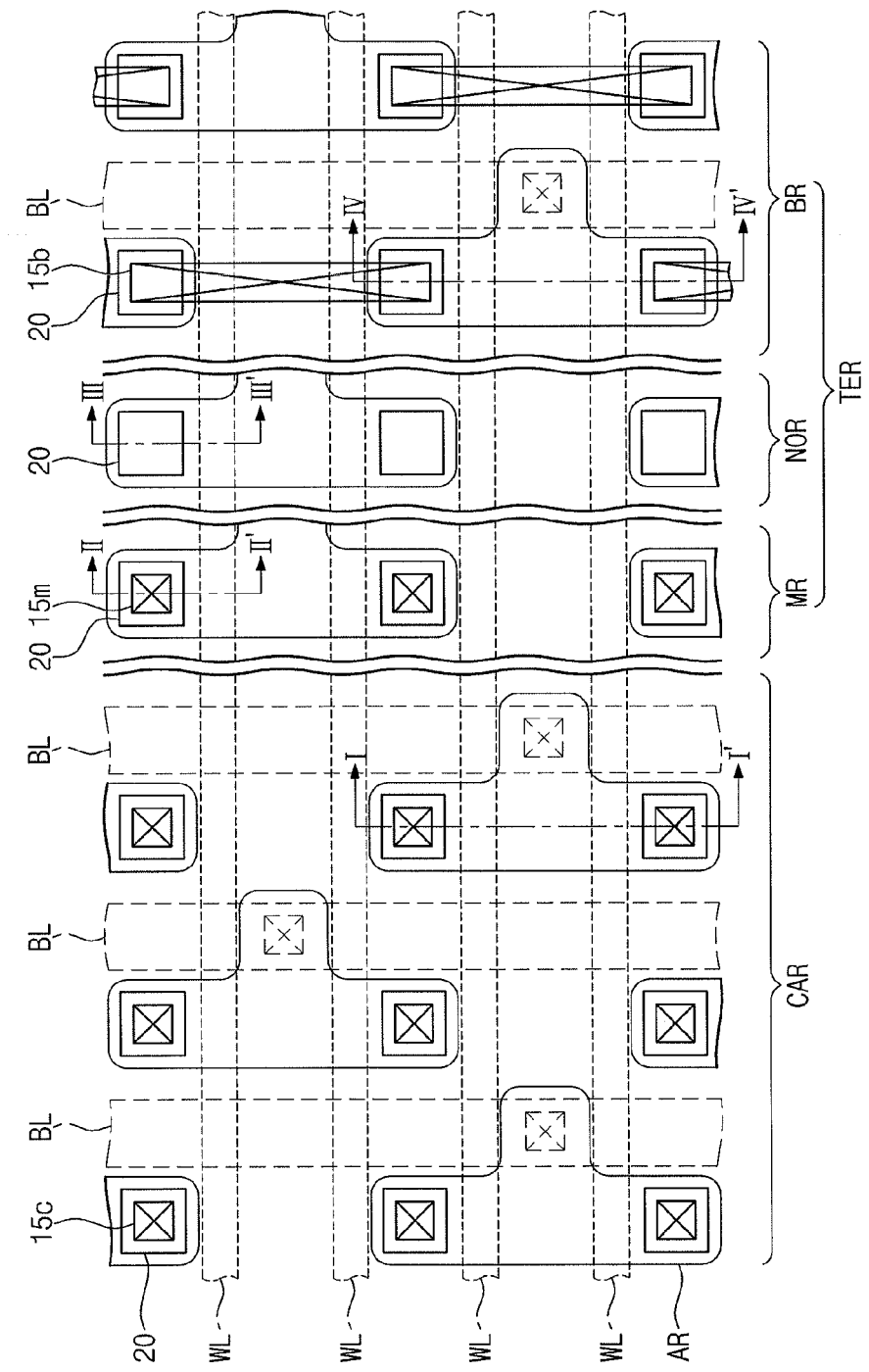
FIG. 12 illustrates a top plan view of a semiconductor device in accordance with an embodiment of the inventive concept.
Figure 13:
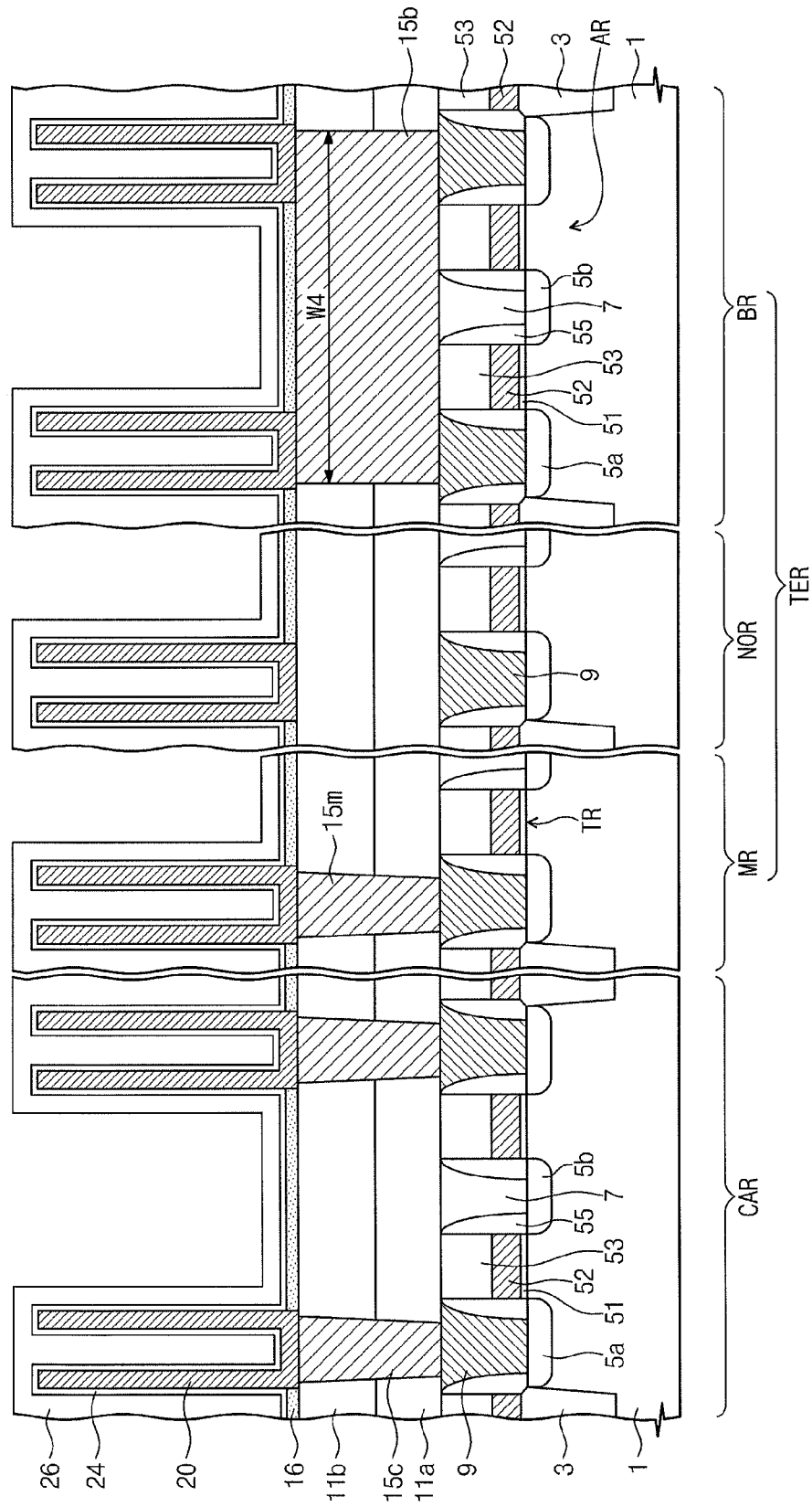
FIG. 13 illustrates a cross sectional view along lines I-I', II-II', III-III', and IV-IV' of FIG. 12.

FIG. 12 is a top plan view of a semiconductor device in accordance with another embodiment of the inventive concept. FIG. 13 is a cross sectional view taken along lines I-I', II-II', III-III', and IV-IV' of FIG. 12.

Referring to FIGS. 12 and 13, in the semiconductor device, the device isolation layer 3 may be disposed in the substrate 1 including the cell array region CAR and the test region TER to define the active region AR. The active region AR may have a 'T' shape when viewed from a top plan view. A plurality of transistors TR may be disposed on the substrate 1. The transistors TR may each include the gate insulating layer 51, the gate electrode 52, and the capping layer pattern 53 that are sequentially stacked, the spacer 55 covering a sidewall of the gate insulating layer 51, the gate electrode 52, and the capping layer pattern 53, and impurity implantation regions 5a and 5b formed in the substrate 1 of both sides of the spacer 55. The impurity implantation regions 5a and 5b may include the source region 5a and a drain region 5b. Two adjacent transistors TR may share the drain region 5b disposed between them. A bit line BL may be electrically connected to the drain region 5b. The bit line BL may cross a word line WL and may be disposed between the second interlayer insulating layers 11a and 11b.

The gate electrode 52 may constitute a word line WL of a line shape crossing the substrate 1 in a specific direction. The plurality of transistors TR may be formed in the same form in each region. A space between the transistors TR may be filled by the first interlayer insulating layer 7.

The first interlayer insulating layer 7 may be formed, and then a planarization process is performed to fill spaces between the transistors TR. The first buried contact plug 9 may be disposed on the source region 5a. The second interlayer insulating layer 11a and 11b may be disposed on the first buried contact plugs 9, the transistors TR, and the first interlayer insulating layer 7. The second buried contact plugs 15c, 15m, and 15b may penetrate the second interlayer insulating layer 11a and 11b to be connected to respective first buried contact plugs 9. The second buried contact plugs 15c, 15m, and 15b may include a second unit cell buried contact plug 15c, a second normal buried contact plug 15m, and a second bridge buried contact plug 15b. The second bridge buried contact plug 15b may have a width W4 equal to or greater than a space W3 between two adjacent second unit cell buried contact plugs 15c. The second buried contact plug may not be disposed in the not-open region NOR. The lower electrode 20 may be disposed on the second interlayer insulating layer 11a and 11b. The lower electrode 20 may overlap the first buried contact plug 9 and may penetrate the support layer 16. The lower electrode 20 may be conformally covered with a dielectric layer 24. The dielectric layer 24 may be covered with an upper electrode 26. The lower electrode 20, the dielectric layer 24, and the upper electrode 26 may constitute a capacitor. One transistor TR and one capacitor electrically connected to the one transistor TR may constitute one unit cell of a DRAM device.

The present inventive concept is not limited to a DRAM device but may be applied to various semiconductor devices, e.g., a nonvolatile memory device like a flash device and a variable resistance device, and a logic device like a SRAM. That is, the inventive concept may be applied to any semiconductor device including a contact plug connecting a lower conductive portion and an upper conductive pattern.

Figure 14:
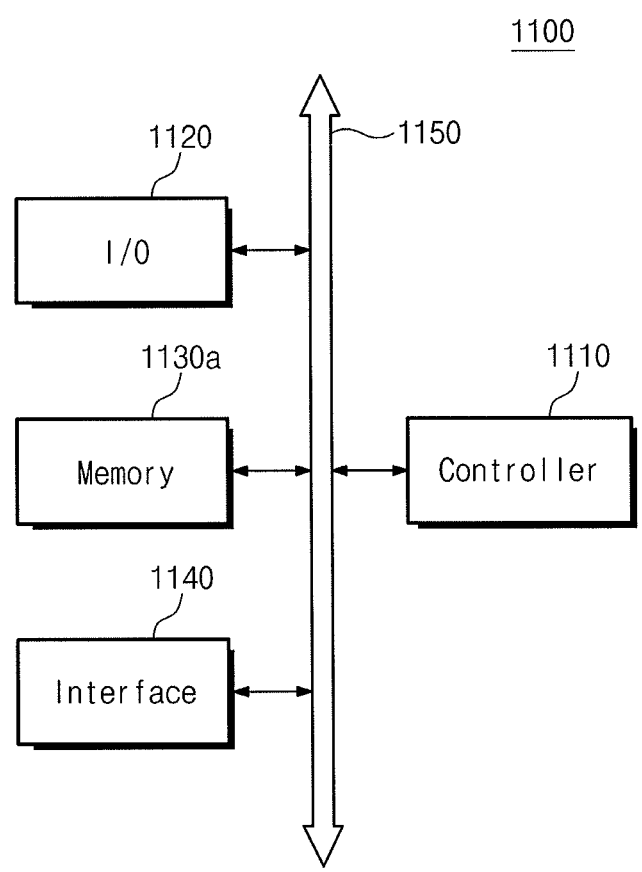
FIG. 14 illustrates a block diagram of an electronic system including a semiconductor device in accordance with some embodiments of the inventive concept.

FIG. 14 is a block diagram of electronic system including a semiconductor device in accordance with some embodiments of the inventive concept.

Referring to FIG. 14, an electronic system 1100 in accordance with an embodiment of the inventive concept may include a controller 1110, an input/output device 1120, a memory device 1130a, an interface 1140, and a bus 1150. The controller 1110, the input/output device 1120, the memory device 1130a, and/or the interface 1140 may be connected to one another through the bus 1150. The bus 1150 corresponds to a path through which data transfers.

The controller 1110 may include at least one of, e.g., a micro processor, a digital signal processor, a microcontroller, and a logic device capable of performing a function similar to the micro processor, the digital signal processor, and the microcontroller. The input/output device 1120 may include, e.g., a keypad, a keyboard, and a display device. The memory device 1130a may store data and/or a command. The memory device 1130a may include the semiconductor memory device disclosed in the embodiment described above. The memory device 1130a may further include a different type of semiconductor memory device (e.g., a DRAM device and/or a DRAM device). The interface 1140 may perform a function of transmitting data to a communication network or receiving data from a communication network. The interface 1140 may be a wireline type and or a wireless type. The interface 1140 may include an antenna or a wireline/wireless transceiver. The electronic system 1110 may further include a high speed DRAM device and/or a SRAM device as an operation memory device to improve an operation of the controller 1110.

The electronic system 1100 may be applied to, e.g., a personal digital assistant (PDA), a portable computer, a web tablet, a mobile phone, a wireless phone, a memory card, a digital music system, or any electronic device that can transmit and/or receive data in a wireless environment.

Figure 15:
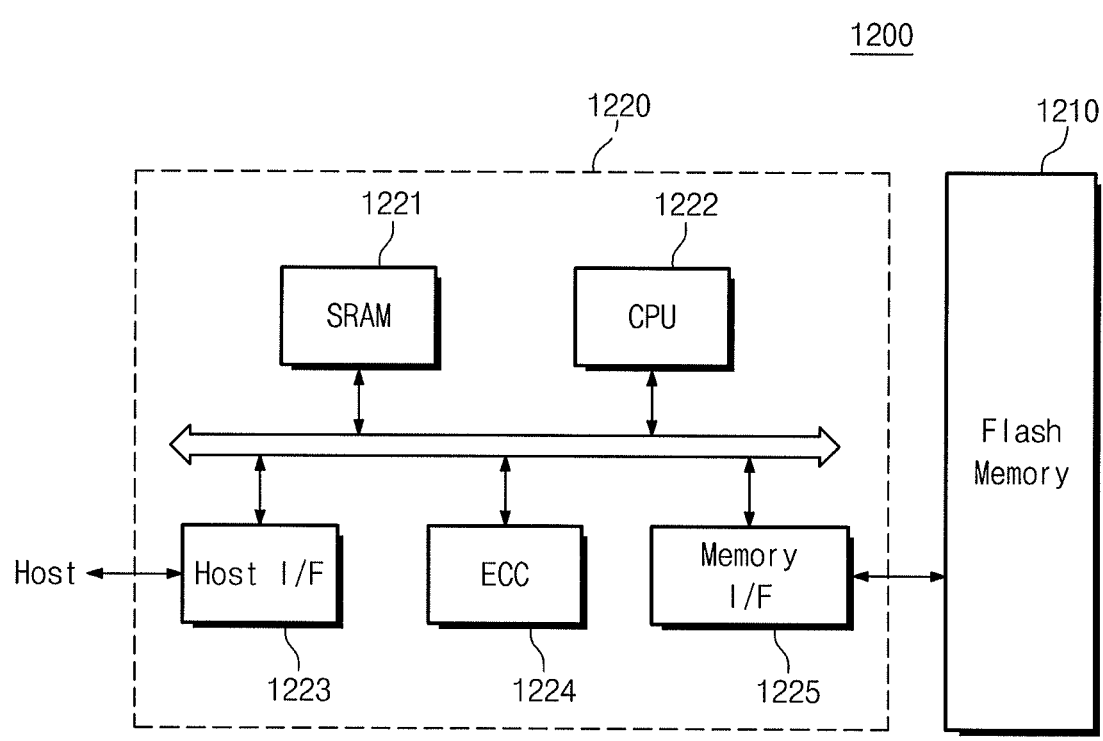
FIG. 15 illustrates a block diagram of a memory card including a semiconductor device in accordance with some embodiments of the inventive concept.

FIG. 15 is a block diagram of a memory card including a semiconductor device in accordance with some embodiments of the inventive concept.

Referring to FIG. 15, a memory card 1200 in accordance with an embodiment of the inventive concept may include a memory device 1210. The memory device 1210 may include the semiconductor device disclosed in the embodiment described above. The memory device 1210 may further include a different type of a semiconductor memory device (e.g., a DRAM device and/or a SRAM device). The memory card 1210 may include a memory controller 1220 controlling a data exchange between a host and the memory device 1210.

The memory controller 1220 may include a central processing unit 1222 controlling the whole operation of the memory card 1200. The memory controller 1220 may include a SRAM 1221 used as an operation memory of the central processing unit 1222. In addition, the memory controller 1220 may further include a host interface 1223 and a memory interface 1225. The host interface 1223 may include a data exchange protocol between the memory card 1200 and the host. The memory interface 1225 may connect the memory controller 1220 and the memory device 1210. Further, the memory controller 1220 may include an error correction code (ECC) block 1224. The error correction code block 1224 may detect and correct an error of data read from the memory device 1210. Although not illustrated in the drawing, the memory card 1200 may further include a ROM device storing code data for interfacing with the host. The memory card 1200 may be used as a portable data storage card. The memory card 1200 may be embodied by a solid state disk (SSD) that can replace a computer hard disk.

A method of detecting a defect of a semiconductor device in accordance with an embodiment of the inventive concept is as follows. Unit cell patterns and test patterns may be formed on the same substrate at the same time. After obtaining reference data by irradiating an electron beam into the test patterns and obtaining cell data by irradiating an electron beam into the unit cell patterns, a defect may be detected by comparing the cell data with the reference data, i.e., in terms of a measured number of emitted electrons.

In contrast, a conventional method of detecting defects may require obtaining accurate information regarding the number/location of real defects in order to set optimum test conditions. However, because the real defects are buried in a semiconductor device due to the structure of the contact plug, it may be difficult to determine the existence, much less location, of defects in a contact plug from a top surface of the semiconductor device. Therefore, it may be very difficult to test and analyze contact defects using the conventional method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of detecting a defect of a semiconductor device, the method comprising:
    forming test patterns and unit cell patterns in a test region and a cell array region of a substrate, respectively;

obtaining reference data with respect to the test patterns by irradiating an electron beam into the test region;

obtaining cell data by irradiating the electron beam into the cell array region; and detecting defects of the unit cell patterns by comparing the obtained cell data with the obtained reference data, wherein forming the test patterns and the unit cell patterns on the substrate includes:

forming lower conductive portions on the test region and the cell array region of the substrate; and forming contact holes exposing the lower conductive portions in the test region and the cell array region, wherein forming the test patterns includes forming same circuits as in the unit cell patterns, except for the contact holes as in the unit cell patterns.

2. The method as claimed in claim 1, wherein the test region includes a normal region, a not-open region, and a bridge region in the substrate.

3. The method as claimed in claim 2, wherein forming the contact holes in the test region and the cell array region includes:

forming an interlayer insulating layer covering the lower conductive portions; and patterning the interlayer insulating layer to form a unit cell contact hole in the cell array region, a normal contact hole in the normal region, and a bridge contact hole in the bridge region, wherein the unit cell contact hole exposes the lower conductive portion in the cell array region, the normal contact hole exposes the lower conductive portion in the normal region, the bridge contact hole exposes simultaneously at least two adjacent lower conductive portions in the bridge region, and the interlayer insulating layer is not patterned in the not-open region.

4. The method as claimed in claim 3, further comprising:

forming a conductive layer to fill each contact hole; and forming an upper conductive pattern overlapping each lower conductive portion on the interlayer insulating layer, irradiating the electron beam being performed after forming the upper conductive pattern.

5. The method as claimed in claim 4, wherein obtaining reference data with respect to the test patterns by irradiating the electron beam includes:

measuring a first quantity of emitted electrons by irradiating the electron beam in the normal region;

measuring a second quantity of emitted electrons by irradiating the electron beam in the not-open region, the second quantity being smaller than the first quantity; and measuring a third quantity of emitted electrons by irradiating the electron beam in the bridge region, the third quantity being greater than the first quantity, and the reference data being obtained from the first through third quantities.

6. The method as claimed in claim 5, wherein:

obtaining the cell data by irradiating the electron beam in the cell array region includes measuring a fourth quantity of emitted electrons from the unit cell patterns by irradiating the electron beam in the cell array region, the fourth quantity corresponding to the cell data, and detecting defects of the unit cell patterns by comparing the cell data with the reference data includes comparing the fourth quantity with the first through third quantities.

7. The method as claimed in claim 4, wherein the upper conductive pattern is a lower electrode of capacitor.

8. The method as claimed in claim 1, wherein forming the unit cell patterns and the test patterns is simultaneous.

9. A method of detecting a defect of a semiconductor device, the method comprising:

forming test patterns and unit cell patterns in a test region and a cell array region of a substrate, respectively, the test region including a normal region, a bridge region, and a not-open region;

irradiating an electron beam into the test region and the cell array region;

measuring a number of emitted electrons from each of the regions in the test region by the electron beam;

measuring a number of emitted electrons from the cell array region by the electron beam; and detecting defects of the unit cell patterns by comparing the measured number of emitted electrons from the cell array region and the test region, wherein forming the test patterns on the substrate includes:

forming a lower conductive portion on the test region of the substrate;

forming an interlayer insulating layer covering the lower conductive portion; and patterning the interlayer insulating layer to form a normal contact hole in the normal region, and a bridge contact hole in the bridge region, and wherein the normal contact hole exposes a first lower conductive portion of the lower conductive portion in the normal region, the bridge contact hole exposes simultaneously at least second and third lower conductive portions of the lower conductive portion in the bridge region, the second and third lower conductive portions being adjacent to each other, and the interlayer insulating layer having no patterns in the not-open region.

10. The method as claimed in claim 9, wherein forming the unit cell patterns on the substrate includes:

forming a lower conductive portion on the cell array region of the substrate;

forming an interlayer insulating layer covering the lower conductive portion on the cell array region of the substrate; and patterning the interlayer insulating layer covering the lower conductive portion on the cell array region of the substrate to form a unit cell contact hole in the cell array region, wherein the unit cell contact hole exposes a fourth lower conductive portion in the cell array region.

11. The method as claimed in claim 10, further comprising:

forming a conductive layer to fill each contact hole; and forming an upper conductive pattern overlapping each lower conductive portion on the interlayer insulating layer, such that the electron beam is irradiated onto the upper conductive pattern.

12. The method as claimed in claim 11, wherein measuring the number of emitted electrons includes:

measuring a first quantity of emitted electrons by the electron beam in the normal region;

measuring a second quantity of emitted electrons by the electron beam in the not-open region, the second quantity being smaller than the first quantity; and measuring a third quantity of emitted electrons by the electron beam in the bridge region, the third quantity being greater than the first quantity.

13. The method as claimed in claim 12, wherein measuring the number of emitted electrons further comprises measuring a fourth quantity of emitted electrons from the unit cell patterns by the electron beam, detecting defects of the unit cell patterns including comparing the fourth quantity with each of the first through third quantities.

14. The method as claimed in claim 11, wherein the upper conductive pattern is a lower electrode of capacitor.

15. A method of detecting a defect of a semiconductor device, the method comprising:
- forming test patterns and unit cell patterns in a test region and a cell array region of a substrate, respectively, the test region including a normal region, a bridge region, and a not-open region;
- irradiating an electron beam into the test region and the cell array region;
- measuring a number of emitted electrons from each of the regions in the test region by the electron beam;
- measuring a number of emitted electrons from the cell array region by the electron beam; and
- detecting defects of the unit cell patterns by comparing the measured number of emitted electrons from the cell array region and the test region,
- wherein comparing the measured number of emitted electrons from the cell array region and the test region includes comparing the number of emitted electrons in the cell array region to the number of emitted electrons from each of the normal region, bridge region, and not-open region of the test region.

16. The method as claimed in claim 15, wherein forming the test patterns includes forming the test patterns in each of the normal region, bridge region, and not-open region.

17. The method as claimed in claim 16, wherein forming the test patterns includes:
- forming a normal contact hole in the normal region; and
- forming a bridge contact hole in the bridge region, wherein no contact holes are formed in the not-open region.

18. The method as claimed in claim 17, wherein forming the test patterns and unit cell patterns includes simultaneously forming the test patterns in the test region and normal contact holes in the cell array region.

* * * * *